May 25, 1965 J. R. PATMORE ETAL 3,185,934
DIRECT COUPLED HIGH GAIN TRANSISTOR AMPLIFIER
INCLUDING SHORT CIRCUIT PROTECTION MEANS
Filed Aug. 6, 1962
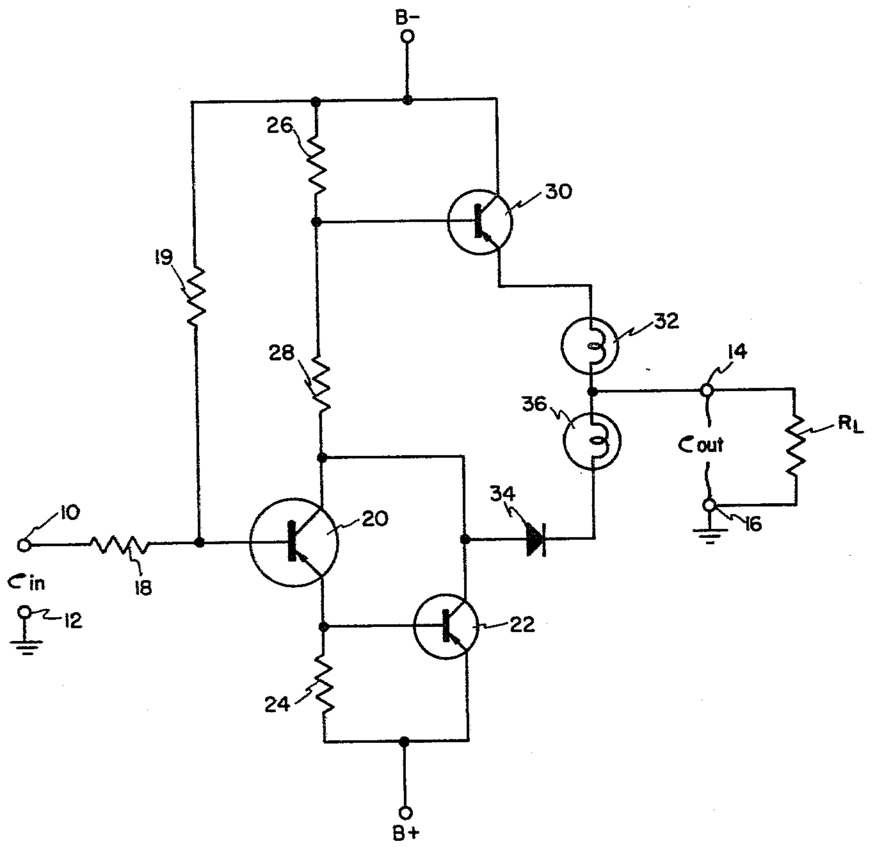
INVENTORS
JAMES R. PATMORE
CHARLES R. KILLIAN
ATTORNEY
E. A. Petho 3,185,934
Patented May 25, 1965

3,185,934

DIRECT COUPLED HIGH GAIN TRANSISTOR AMPLIFIER INCLUDING SHORT CIRCUIT PROTECTION MEANS

James R. Patmore, Neptune, N.J., and Charles R. Killian, Baton Rouge, La., assignors to Electronic Associates Inc., Long Branch, N.J., a corporation of New Jersey Filed Aug. 6, 1962, Ser. No. 214,889
8 Claims. (Cl. 330—19)

This invention relates generally to D.C. amplifiers and more particularly to a direct-coupled, high-gain transistor amplifier with high input impedance and provisions for output circuit short-circuit protection.

In order to obtain linear amplification of bipolar input signals, some amplifier designs resort to the use of a pair of complementary emitter follower output stages. This arrangement of output transistors produces generally acceptable amplifier performance. Often, however, when improved performance is required, it is necessary to match the characteristics of the complementary pair of transistors in order to obtain the desired linearity of output signals. This occurs largely because of the inherent nature of transistor materials and the manner in which transistors are produced. By way of example, it is believed well known that the majority of PNP transistors are of the germanium type while the majority of NPN transistors utilize silicon as the semiconducting material. It is also believed well known that the characteristics of NPN and PNP transistors are not exactly complementary and that NPN germanium and PNP silicon transistors with complementary characteristics are available, but at a significant premium in price.

The invention which forms the subject matter of the present invention overcomes the disadvantage of matching complementary transistor characteristics and allows for linear amplification of bipolar input signals by the use of transistors of a single type. In addition, the amplifier, according to the present invention, is provided with high input impedance and circuitry to provide short-circuit protection for the amplifier output stage.

In its preferred form, the amplifier according to the present invention comprises a pair of emitter follower stages which are connected in compound and a third emitter follower stage connected to the common-collector juncture of the pair of emitter follower stages. For input signals of one polarity, the compound connected common-emitter stage functions as a voltage amplification stage in conjunction with the third emitter follower stage. Opposite polarity input signals are amplified by the pair of emitter follower stages. Incandescent bulbs disposed in the output of the amplifier provide short-circuit protection for the output transistors.

It is accordingly an object of the present invention to provide a D.C. amplifier for the linear amplification of bipolar signals which utilizes transistors of a single type.

It is another object of the present invention to provide a D.C. amplifier for the linear amplification of bipolar D.C. signals which uses relatively inexpensive components and provides improved reliability and operation.

These and other objects, features and advantages will become apparent from the following description taken in connection with the single figure of the accompanying drawing which shows a preferred embodiment of an amplifier according to the present invention utilizing all PNP transistors.

In the drawing the input signal is applied between the terminals 10 and 12, the latter of which is grounded to form a single-ended input. Terminals 14, 16 are the output and the latter is grounded to provide a single-ended output. A suitable load $R_L$ may be connected between the output terminals. The input circuit includes a voltage divider which consists of a resistor 18 connected in series with the input terminal 10 and a resistor 19 connected between the other terminal of the resistor 18 and a source of power designated B−. A transistor 20 which is connected in compound with a transistor 22 receives the input signal at its base which is connected to the junction point of resistors 18 and 19. The emitter of transistor 20 is coupled directly to the base of transistor 22 and a resistor 24 couples this base-emitter juncture to a power source B+. A pair of serially-connected coupling resistors 26, 28, connect the collector of transistor 20 to the power source B−, which may supply a D.C. voltage of −60 volts. Transistor 22 has its collector connected directly to the collector of transistor 20 and has its emitter connected directly to the power source B+, which may supply a D.C. voltage of +60 volts.

The transistors 20, 22 form a well-known compound-connected common-emitter stage which has a short-circuit current-transfer ratio very close to unity. The input impedance for the stage is very high and the stabilization of such a circuit is excellent, owing to the non-linear compensation of one transistor by the other. As a result of the inherent large amount of feedback involved, this circuit is relatively insensitive to changes in transistor parameters.

A transistor 30 which is connected as an emitter follower receives an input signal at its base which is connected to the junction point of resistors 26 and 28. The resistors 26 and 28 function as a voltage divider for the input of the transistor 30. The collector of transistor 30 is connected directly to the power source B− and the emitter of this transistor is connected to the load $R_L$ via a suitable incandescent bulb 32. The present amplifier circuit is completed by the connection of a suitable diode 34 in series with another similar incandescent bulb 36 between the collector of transistor 22 and the terminal 14.

The circuit described operates to produce a substantially linear output for either polarity of input signal within its normal operating range. The various circuit resistors are selected to be of such size that in a quiescent condition of the circuit, zero output signal exists when the input signal is zero. In this quiescent condition, the base of transistor 20 and the base of transistor 22 are biased slightly negative to produce a slight amount of current flow in their respective collector and emitter leads. The collector current which flows in the circuit comprising the resistors 26 and 28 produces a slight negative bias at the base of transistor 30 with the attendant result that current flows from the collectors of transistors 20, 22 through diode 34, the bulbs 36 and 32 to the emitter of transistor 30. The current flowing from the collectors of transistors 20, 22 to the emitter of transistor 30 is of such amplitude relative to the impedance of diode 34 and bulbs 32 and 36 that zero output exists at the terminal 14.

If the input signal to the base of transistor 20 now becomes positive and increases in amplitude, it tends to increase the voltage drop across the emitter-collector junction of transistor 20 with the attendant result that less current flows through resistor 28 and the base of transistor 30 becomes increasingly more negative. Since transistor 30 is connected as an emitter follower, the application of this signal to its base drives it toward saturation so that the voltage drop across its emitter-collector junction decreases. This action causes the voltage at the emitter of transistor 30 to approach the voltage of the B− power source, i.e., it becomes more negative, and the voltage drop across the load resistor $R_L$ increases. Depending upon the amplitude of the positive input signal which is applied to terminal 10 of the amplifier and on the amplification factors of the transistors 20 and 30, the amplitude of the negative D.C. output signal which is derived at the output terminal 14 will vary linearly between 0 and −60 volts. Transistors 20 and 22 impart voltage gain to the input signal while transistor 30 provides current gain to the input signal.

While the output signal at the terminal 14 is negative, the base-emitter voltage drop of transistor 30 and the voltage drop across bulb 32 is such that the base lead of transistor 30 is maintained more negative than the terminal 14. Accordingly, the diode 34 is back-biased by the base voltage of transistor 30 and the diode serves to block any flow of current that might otherwise occur from the terminal 14 directly back to the base terminal of this transistor.

When the input signal applied to terminal 10 becomes negative, the emitter-collector voltage drop of transistor 20 decreases and the collector voltage of this transistor rises toward the voltage of the emitter B+ power source. An increased amount of negative current flows in the emitter lead of transistor 20 and this current causes transistor 22 to become increasingly more forward biased. Transistor 22 conducts more heavily with the result that its emitter-collector voltage drop also decreases and its collector approaches the voltage of its emitter supply B+. The fact that the collector of transistor 22 becomes increasingly more positive causes the diode 34 to conduct and the signal applied to the output terminal 14 rises toward the supply voltage B+ or +60 volts. For negative input signals, transistor 20 is seen to operate as an emitter follower and transistor 22 is seen to provide voltage amplification to its applied input signal.

It should be noted when the input signal to transistor 20 is negative, a positive voltage appears at its collector terminal and biases the base of transistor 30 to a condition of cut-off. As in the conducting condition of transistor 30, the amplitude of the negative input signal which is applied to terminal 10 and the amplification factors of the transistors 20 and 22 determine the amplitude of the positive D.C. voltage which is derived at the output terminal 14. In the described embodiment of the amplifier, the D.C. voltage at terminal 14 will vary linearly between 0 and slightly less than +60 volts.

The incandescent bulbs 32 and 36 are preferably provided with tungsten filaments and serve to provide short-circuit protection for the amplifier. These bulbs are selected to be of such rating that within the normal operating range of the output transistors 30 and 22, insufficient current flows through the bulb filaments to produce a condition of incandescence. However, should the output of the amplifier become short-circuited, sufficient current is drawn from the then conducting transistor to produce a condition of incandescence in the filament of the corresponding bulb.

As is well known, a typical tungsten filament has a positive temperature coefficient and resistance characteristic which carries non-linearly with increases in temperature. When the current flowing through a filament is low and the filament is not heated to incandescence, the resistance of the filament is low. When the amplitude of the current is high enough to produce incandescence, the resistance of the filament increases rapidly and non-linearly. In the present embodiment the bulbs normally operate in a region where they do not adversely affect the linear amplification of the applied input signals. By appropriate selection, the non-linearity of the resistance characteristic of inexpensive tungsten filament bulbs serve admirably to limit the short-circuit current which would otherwise be drawn from an output transistor. Accordingly, the otherwise destructive effects of thermal runaway of transistors 22 and 30 is entirely eliminated.

Although a preferred embodiment of the invention has been described, the invention is not confined to the precise circuit which is illustrated. For example, either all PNP or all NPN transistors may be used provided the proper polarities are used. The D.C. power supplies are not, of course, confined to the specific voltages disclosed herein, but may be properly poled D.C. voltages of any desired amplitude consistent with the circuit requirements.

From the foregoing, it will be clear to those skilled in the art that other embodiments within the scope of the subjoined claims may be employed.

We claim:

1. A D.C. amplifier comprising an input terminal, an output terminal, first and second transistors connected in compound common-emitter configuration between said input and output terminals, a third transistor connected to receive an input signal at its base from the common collector juncture of said first and second transistors, and means including first and second incandescent bulbs having a first connection to the emitter of said third transistor, a second connection to the common collector juncture of said first and second transistors and a third connection to said output terminal.

2. A D.C. amplifier according to claim 1 including an asymmetrical conducting device connected in series circuit relation with said means and between said output terminal and the common collector juncture of said first and second transistors for preventing the flow of current from said output terminal to said third transistor.

3. A D.C. amplifier comprising an input terminal, an output terminal, a pair of transistors being connected in compound common-emitter configuration and receiving an input signal from said input terminal, a third transistor being connected in an emitter-follower configuration and being coupled to receive an input signal from the common collector connection of said pair of transistors, and means including a pair of incandescent bulbs having a first connection to the common collector junction of said pair of transistors, a second connection to the emitter of said third transistor and a third connection to said output terminal.

4. A D.C. amplifier according to claim 3 including an asymmetrical conducting device connected in series circuit relation with said means and between said output terminal and the common collector juncture of said pair of transistors for preventing the flow of current from said output terminal to said third transistor.

5. A D.C. amplifier comprising an input terminal, an output terminal, a pair of transistors having their collectors connected in common and having the emitter of one transistor of the pair connected to the base of the other transistor of the pair, means including a first voltage divider network coupling said input terminal to a source of biasing potential and to the base of one transistor of the pair, means including another voltage divider network coupling the common collector juncture of the pair of transistors to said source of biasing potential and to the base of a third transistor connected in an emitter-follower configuration, and means including a pair of incandescent bulbs and a semiconducting diode element having a first connection to the common collector juncture of said pair of transistors, a second connection to the emitter of said third transistor and a third connection to said output terminal.

6. A D.C. amplifier according to claim 5 wherein said diode element is connected between said pair of bulbs and said common collector juncture and said output terminal is connected intermediate said pair of bulbs whereby flow of current from said output terminal to the base of said first transistor is blocked when said first transistor is biased to conduction.

7. A D.C. amplifier comprising an input terminal and an output terminal, first and second transistor means, means connecting a base of said first transistor means to said input terminal, means connected to a collector of said first transistor means for applying an input signal to a base of said second transistor means, output means including short circuit protection means having (1) a first connection to an emitter of said second transistor means, (2) a second connection to said collector of said first transistor means and (3) a third connection to said output terminal, and a diode connected in series circuit relation with said output means and between said output terminal and said collector of said first transistor means for preventing the flow of current from said output terminal to said second transistor means.

8. A D.C. amplifier comprising an input terminal and an output terminal, first transistor means, means connecting a base of said first transistor means to said input terminal, a second transistor means being connected to receive an input signal at its base from the collector of said first transistor means, means including a diode connected between said collector of said first transistor means and said output terminal, and means including at least one short circuit protection device connecting said emitter of said second transistor to said output terminal.

No references cited.

ROY LAKE, *Primary Examiner.*

NATHAN KAUFMAN, *Examiner.*